US011446754B2

(12) United States Patent
Hutchison et al.

(10) Patent No.: US 11,446,754 B2
(45) Date of Patent: *Sep. 20, 2022

(54) DEVICES AND METHODS FOR ANALYZING SPATTER GENERATING EVENTS

(71) Applicant: Illinois Tool Works Inc., Glenview, IL (US)

(72) Inventors: Richard Martin Hutchison, Appleton, WI (US); Todd Holverson, Appleton, WI (US); James Lee Uecker, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/939,863

(22) Filed: Jul. 27, 2020

(65) Prior Publication Data
US 2020/0353553 A1 Nov. 12, 2020

Related U.S. Application Data

(63) Continuation of application No. 15/703,612, filed on Sep. 13, 2017, now Pat. No. 10,722,968, which is a (Continued)

(51) Int. Cl.
*B23K 9/095* (2006.01)
*B23K 9/09* (2006.01)
(Continued)

(52) U.S. Cl.
CPC ............. *B23K 9/0953* (2013.01); *B23K 9/09* (2013.01); *B23K 9/0956* (2013.01); *B23K 31/125* (2013.01); *G01R 31/40* (2013.01)

(58) Field of Classification Search
CPC ...... B23K 9/0953; B23K 9/09; B23K 9/0956; B23K 31/125; G01R 31/40
See application file for complete search history.

(56) References Cited

U.S. PATENT DOCUMENTS 5,756,967 A * 5/1998 Quinn .................. B23K 9/09
219/130.01
6,025,573 A 2/2000 Stava
(Continued)

FOREIGN PATENT DOCUMENTS

EP 1769875 4/2007
JP H07100662 4/1995
(Continued)

OTHER PUBLICATIONS http://www.lincolnelectric.com/assets/en_US/Products/literature/MC09105.pdf.
International Search Report from PCT application No. PCT/US2013/034229 dated Jul. 5, 2013, 13 pgs.

Primary Examiner — Bryan Bui
(74) Attorney, Agent, or Firm — McAndrews, Held & Malloy, Ltd.

(57) ABSTRACT

A method for monitoring a spatter generating event during a welding application. The method includes capturing data that corresponds to a welding current of the welding application. The method also includes detecting parameters associated with a short circuit from the captured data. The method includes analyzing the detected parameters to monitor the spatter generating event during the welding application.

20 Claims, 5 Drawing Sheets

Related U.S. Application Data continuation of application No. 14/930,038, filed on Nov. 2, 2015, now Pat. No. 9,764,408, which is a continuation of application No. 13/436,373, filed on Mar. 30, 2012, now Pat. No. 8,601,088.

(51) Int. Cl.
  *B23K 31/12* (2006.01)
  *G01R 31/40* (2020.01)

(56) References Cited

U.S. PATENT DOCUMENTS

| | | | |
|---|---|---|---|
| 6,087,627 A | 7/2000 | Kramer | |
| 6,326,591 B1 | 12/2001 | Hutchinson | |
| 6,441,342 B1 | 8/2002 | Hsu | |
| 6,624,388 B1 | 9/2003 | Blankenship et al. | |
| 6,642,483 B1 | 11/2003 | Koga | |
| 6,747,247 B2 | 6/2004 | Holverson | |
| 6,795,778 B2 | 9/2004 | Dodge et al. | |
| 6,909,067 B2 | 6/2005 | Davidson | |
| 6,940,039 B2 | 9/2005 | Blankenship | |
| 7,375,304 B2 | 5/2008 | Kainec et al. | |
| 8,723,078 B2 | 5/2014 | Mazumder | |
| 8,742,280 B2 * | 6/2014 | Vogel | B23K 9/1043 219/74 |
| 10,722,968 B2 * | 7/2020 | Hutchison | B23K 9/0956 |
| 2010/0007902 A1 | 1/2010 | Kikuchi | |
| 2010/0048273 A1 | 2/2010 | Wallace | |
| 2012/0298643 A1 | 11/2012 | Lambert | |

FOREIGN PATENT DOCUMENTS

| | | |
|---|---|---|
| JP | 2001321942 | 11/2001 |
| JP | 2009066612 | 4/2009 |

\* cited by examiner

DEVICES AND METHODS FOR ANALYZING SPATTER GENERATING EVENTS

CROSS REFERENCE TO RELATED APPLICATIONS

This application is a Continuation Patent Application from U.S. patent application Ser. No. 15/703,612, entitled "Devices and Methods for Analyzing Spatter Generating Events", filed on Sep. 13, 2017, which is a Continuation Patent Application from U.S. patent application Ser. No. 14/930,038, entitled "Devices and Methods for Analyzing Spatter Generating Events", filed Nov. 2, 2015, which issued as U.S. Pat. No. 9,764,408 on Sep. 19, 2017, which is a Continuation Patent Application from U.S. patent application Ser. No. 13/436,673, entitled "Devices and Methods for Analyzing Spatter Generating Events", filed Mar. 30, 2012, which issued as U.S. Pat. No. 9,174,294 on Nov. 3, 2015, all of which are herein incorporated by reference in their entireties for all purposes.

BACKGROUND

The invention relates generally to welding applications, and, more particularly, to devices and methods for analyzing spatter generating events.

Welding is a process that has become increasingly utilized in various industries and applications. Such processes may be automated in certain contexts, although a large number of applications continue to exist for manual welding applications. In both cases, such welding applications rely on a variety of types of equipment to ensure that the supply of welding consumables (e.g., wire, shielding gas, etc.) is provided to the weld in an appropriate amount at the desired time. For example, metal inert gas (MIG) welding typically relies on a wire feeder to enable a welding wire to reach a welding torch. The wire is continuously fed during welding to provide filler metal. A power source ensures that arc heating is available to melt the filler metal and the underlying base metal.

In certain welding applications, spatter may be inadvertently generated. Such spatter may include unwanted pieces or balls of molten metal that are created and adhere to a workpiece during the welding application. In various industries, a workpiece having spatter thereon may be considered a sign of poor quality. Spatter may be generated due to a variety of factors, such as material conditions, workpiece positioning, power supply characteristics, outgassing of vaporized materials, operator technique, and so forth. As such, an experienced operator may be able to detect spatter generating conditions by the sound of the arc. For example, an arc without spatter generating conditions may have a steady, consistent frequency. In contrast, an arc with spatter generating conditions typically has an unsteady frequency and an intermittent stumbling sound. However, in certain circumstances, an experienced welding operator may ignore potential spatter generating conditions (e.g., due to increased time pressures, part conditions, personal comfort, etc.) and compromise the quality of the workpiece. Further, certain welding operators may be inexperienced and unable to detect spatter generating events. Accordingly, there is a need in the field for techniques to monitor a welding application for spatter generating events.

BRIEF DESCRIPTION

In one embodiment, a method for monitoring a spatter generating event during a welding application includes capturing data that corresponds to a welding current of the welding application. The method also includes detecting parameters associated with a short circuit from the captured data. The method includes analyzing the detected parameters to monitor the spatter generating event during the welding application.

In another embodiment, a non-transitory tangible machine-readable medium has code stored thereon. The code includes instructions for capturing data that corresponds to a welding current of the welding application. The code also includes instructions for detecting parameters associated with a short circuit from the captured data. The code includes instructions for analyzing the detected parameters to monitor the spatter generating event during the welding application and to determine an amount of spatter generated by the spatter generating event.

In another embodiment, a method for monitoring an amount of spatter generated during a welding application includes detecting parameters associated with spatter generating events occurring during the welding application. The method also includes analyzing the detected parameters to determine the amount of spatter generated by the spatter generating events. The method includes communicating the determined amount of spatter generated by the spatter generating events. The method may include the ability to set thresholds at increasing severity levels such as recording and archiving the event, activating an alert, and actually shutting down the equipment to prevent poor quality production.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
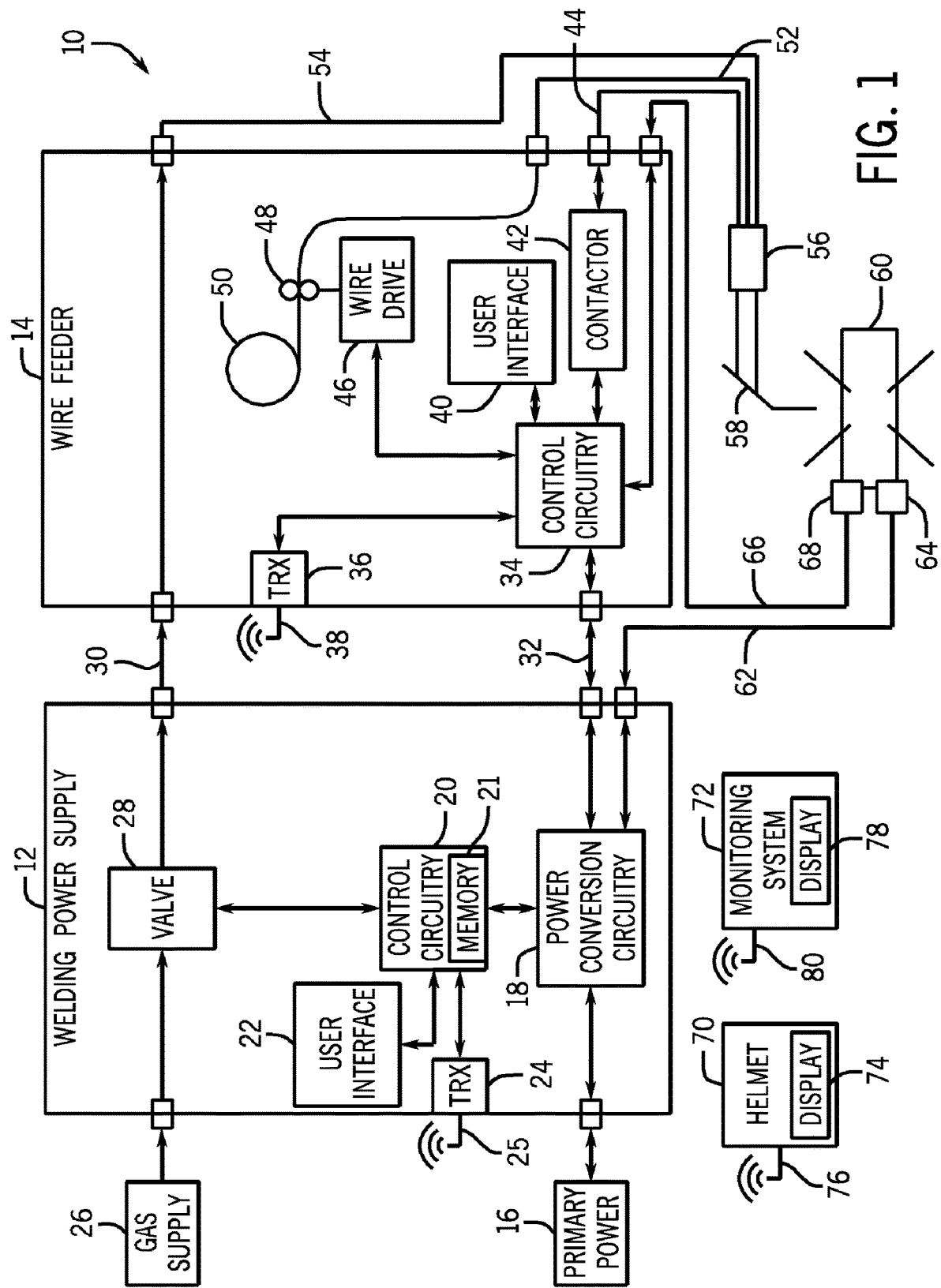
FIG. 1 is a block diagram of an embodiment of a welding system employing a device for analyzing spatter generating events in accordance with aspects of the present disclosure.

Turning now to the drawings, FIG. 1 is a block diagram of an embodiment of a welding system 10 with a device for analyzing spatter generating events. In the illustrated embodiment, the welding system 10 is a gas metal arc welding (GMAW) system, sometimes referred to by its subtypes metal inert gas (MIG) welding or metal active gas (MAG) welding, although the present techniques may be used on other welding systems where spatter is a concern, such as flux cored arc welding (FCAW), shielded metal arc welding (SMAW), and so forth. The welding system 10 powers, controls, and supplies consumables to a welding application. The welding system 10 includes a welding power supply 12 and a voltage sensing wire feeder 14. As will be appreciated, other embodiments may include a non-voltage sensing wire feeder 14.

The welding power supply 12 receives primary power 16 (e.g., from the AC power grid, an engine/generator set, a battery, or other energy generating or storage devices, or a combination thereof), conditions the primary power, and provides an output power to one or more welding devices in accordance with demands of the system 10. The primary power 16 may be supplied from an offsite location (i.e., the primary power may originate from the power grid). Accordingly, the welding power supply 12 includes power conversion circuitry 18 that may include circuit elements such as transformers, rectifiers, switches, and so forth, capable of converting the AC input power to AC or DC output power as dictated by the demands of the system 10 (e.g., particular welding processes and regimes). Such circuits are generally known in the art.

In some embodiments, the power conversion circuitry 18 may be configured to convert the primary power 16 to both weld and auxiliary power outputs. However, in other embodiments, the power conversion circuitry 18 may be adapted to convert primary power only to a weld power output, and a separate auxiliary converter may be provided to convert primary power to auxiliary power. Still further, in some embodiments, the welding power supply 12 may be adapted to receive a converted auxiliary power output directly from a wall outlet. Indeed, any suitable power conversion system or mechanism may be employed by the welding power supply 12 to generate and supply weld and auxiliary power.

The welding power supply 12 includes control circuitry 20. The control circuitry 20 includes at least one controller that controls the operations of the welding power supply 12, and may be configured to receive and process a plurality of inputs regarding the performance and demands of the system 10. Furthermore, the control circuitry 20 may include volatile or non-volatile memory 21, such as ROM, RAM, magnetic storage memory, optical storage memory, or a combination thereof. In addition, a variety of control regimes for various welding processes, along with associated settings and parameters may be stored in the memory along with code configured to provide a specific output (e.g., initiate wire feed, enable gas flow, capture welding current data, detect short circuit parameters, determine amount of spatter, etc.) during operation.

The welding power supply 12 may include a user interface 22. The control circuitry 20 may receive input from the user interface 22 through which a user may choose a process, and input desired parameters (e.g., voltages, currents, particular pulsed or non-pulsed welding regimes, and so forth). Furthermore, the control circuitry 20 may control parameters input by the user as well as any other parameters. Specifically, the user interface 22 may include a display for presenting, or indicating, information to an operator (e.g., when spatter generating events occur, an accumulated amount of spatter, etc.). The control circuitry 20 may include interface circuitry for communicating data to other devices in the system 10, such as the wire feeder 14. The welding power supply 12 may include a transceiver 24 for wirelessly communicating 25 with other devices. In certain embodiments, the welding power supply 12 may communicate with other devices using a wired connection, or some other communication method.

A gas supply 26 provides shielding gases, such as argon, helium, carbon dioxide, and so forth, depending upon the welding application. The shielding gas flows to a valve 28, which controls the flow of gas, and if desired, may be selected to allow for modulating or regulating the amount of gas supplied to a welding application. The valve 28 may be opened, closed, or otherwise operated by the control circuitry 20 to enable, inhibit, or control gas flow through the valve 28. For example, when the valve 28 is closed, shielding gas may be inhibited from flowing through the valve 28. Conversely, when the valve 28 is opened, shielding gas is enabled to flow through the valve 28. Shielding gas exits the valve 28 and flows through a cable or hose 30 (which in some implementations may be packaged with the welding power output) to the wire feeder 14 which provides the shielding gas to the welding application.

Welding power flows through a cable 32 to the wire feeder 14. The wire feeder 14 may use the welding power to power the various components in the wire feeder 14, such as to power control circuitry 34. The control circuitry 34 controls the operations of the wire feeder 14. The wire feeder 14 also includes a transceiver 36 for wirelessly communicating 38 with the welding power supply 12, or another device. In some embodiments, the wire feeder 14 may communicate with other devices using a wired connection.

The wire feeder 14 includes a user interface 40. The control circuitry 34 may receive input from the user interface 40, such as via methods and devices described in relation to the user interface 22. Furthermore, the control circuitry 34 may display information to an operator, such as voltage, current, wire speed, wire type, when spatter events occur, spatter accumulation, running count of spatter events, average rate of spatter events, and so forth. The wire feeder 14 may include a contactor 42 (e.g., high amperage relay) which is controlled by the control circuitry 34 and configured to enable or inhibit welding power to flow to a weld power cable 44 for the welding application. In certain embodiments, the contactor 42 may be an electromechanical device, while in other embodiments the contactor 42 may be any other suitable device, such as a solid state device. The wire feeder 14 includes a wire drive 46 that receives control signals from the control circuit 34 to drive rollers 48 that rotate to pull wire off a spool 50 of wire. The wire is provided to the welding application through a cable 52. Likewise, the wire feeder 14 may provide shielding gas through a cable 54. As may be appreciated, the cables 44, 52, and 54 may be bundled together with a coupling device 56.

A torch 58 uses the wire, welding power, and shielding gas for a welding application. Further, the torch 58 is used to establish a welding arc between the torch 58 and a workpiece 60. A work cable 62, which may be terminated with a clamp 64 (or another power connecting device), couples the welding power supply 12 to the workpiece 60 to complete a welding power circuit. As illustrated, a voltage sense cable 66 is coupled from the wire feeder 14 to the workpiece 60 using a sense clamp 68 (or another power connecting mechanism). The wire feeder 14 is connected to the welding power supply 12 so that it may operate even when a welding arc is not formed by the torch 58. Specifically, the wire feeder 14 receives welding power from the welding power supply 12 through cable 32. However, in certain embodiments, the wire feeder 14 may be powered through an alternate cable. In such embodiments, the voltage sense cable 68 may be replaced by wiring within the alternate cable. The welding power is connected to the various components in the wire feeder 14 (e.g., control circuitry 34, wire drive 46, user interface 40). A return path for the wire feeder 14 power is formed using the sense cable 66 with the sense clamp 68 connected to the workpiece 60. Further, the work cable 62 with the work clamp 64 provide the final portion of the return path to the welding power supply 12. Thus, the return path includes the cable 66, the workpiece 60, and the cable 62.

As illustrated, the welding system 10 includes a welding helmet 70 and a welding monitoring system 72. The welding helmet 70 includes a display 74 or human interface (e.g., light emitting diodes (LEDs), liquid crystal displays (LCDs), vibration device, audio transducer, etc.) to communicate information to a welding operator (e.g., such as when spatter related events occur, an average rate of spatter events, or an accumulated amount of spatter generated). The welding helmet 70 wirelessly communicates 76 with other devices, such as the welding power supply 12, the wire feeder 14, and/or the welding monitoring system 72. In certain embodiments, the welding helmet 70 may include a speaker to provide audio feedback to the welding operator (e.g., audio information about spatter, etc.). The welding monitoring system 72 also includes a display 78 for displaying data, such as spatter related information. Further, the welding monitoring system 72 wirelessly communicates 80 with other devices (the welding monitoring system 72 may also communicate with wired communication). As will be appreciated, any of the devices in the welding system 10 may be used to monitor, capture, process, analyze, and/or display data relating to spatter generating events. For example, the welding power supply 12, the wire feeder 14, the welding helmet 70, and/or the welding monitoring system 72 may be used to monitor, capture, process, analyze, and/or display data relating to spatter generating events. As such, feedback relating to spatter generating events may be provided to the welding operator, a monitoring system, and/or a manager.

Figure 2:
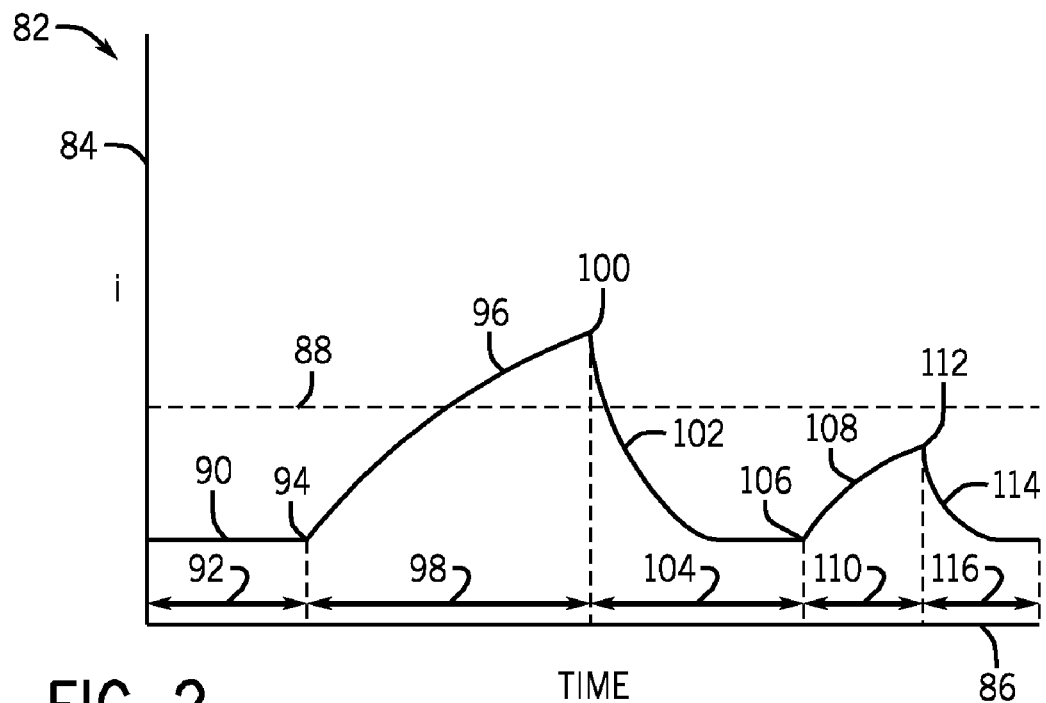
FIG. 2 is a graph illustrating an embodiment of a method for monitoring a spatter generating event using a threshold current in accordance with aspects of the present disclosure.

It should be noted that spatter generating events may be detected in a variety of ways. FIGS. 2 through 5 illustrate a few embodiments of how spatter generating events may be detected. Accordingly, FIG. 2 is a graph 82 illustrating an embodiment of a method for monitoring a spatter generating event based on a welding current 84. Specifically, the graph 82 illustrates the welding current 84 during time 86. As will be appreciated, if a short circuit clears when the welding current 84 is high (e.g., approximately 500 amps), a large amount of power may be present resulting in a significant spatter generating event. Accordingly, time periods on the graph 82, where the welding current 84 is greater than a threshold current 88, indicate time periods where it is likely that significant spatter generating events occur.

For example, at segment 90, the welding current 84 signifies a welding arc current during a time period 92. A point 94 at the intersection of segments 90 and 96 indicates a start of a short circuit. The short circuit continues through segment 96 during a time period 98 until the short circuit clears at point 100. Accordingly, the welding current 84 at point 100 is considered the short circuit clearing current. As discussed above, a significant spatter generating event is likely to occur when the welding current 84 (e.g., short circuit clearing current) is greater than the threshold current 88. Therefore, because point 100 is greater than the threshold current 88, it is likely that a significant spatter generating event has occurred.

Time periods on the graph 82, where the welding current 84 is less than the threshold current 88, indicate time periods where it is likely that spatter generating events do not occur. For example, at segment 102, the welding current 84 signifies a welding arc current during a time period 104. A point 106 at the intersection of segments 102 and 108 indicates a start of another short circuit. The short circuit continues through segment 108 during a time period 110 until the short circuit clears at point 112. Because short circuit clearing current at point 112 is less than the threshold current 88, it is likely that a spatter generating event has not occurred at point 112. As illustrated at segment 114, the welding current 84 returns to a welding arc current during time 116. Thus according to the method described using the graph 82, significant spatter generating events may be detected.

In addition to detecting when spatter generating events occur, parameters associated with a short circuit may be used to determine an amount or severity of spatter generated by the spatter generating event. For example, an amount of spatter may be determined by the following equation: $I_{CLEAR}^2/(I_{AVG}^2 * T_{SHORT})$. In this equation, $I_{CLEAR}^2$ represents the short circuit clearing current (e.g., current at point 100) squared, $I_{AVG}^2$ represents an average of the welding current 84 over a time period (e.g., such as 1 to 3 seconds) squared, and $T_{SHORT}$ (in milliseconds) represents the length of time of the short circuit (e.g., time 98 for the short represented by segment 96). It should be noted that such an equation may work well for short circuits of a short duration (e.g., less than one millisecond). For short circuits that have a longer duration, the following equation may be used: $I_{CLEAR}^2/I_{AVG}^2$. For either short or long duration short circuits, the average welding current ($I_{AVG}^2$) in the denominator may help to normalize the resultant but also take into account the amount of spatter generated that clears the depression in the puddle. For example, at higher average currents, there may be a deeper depression in the puddle caused by a more powerful arc force. The deeper depression may trap some of the spatter therein. Further, at very high currents, a complete ball transfer may occur below an upper lip of the depression. According to the techniques described, an amount or severity of a spatter generating event may be determined.

Figure 3:
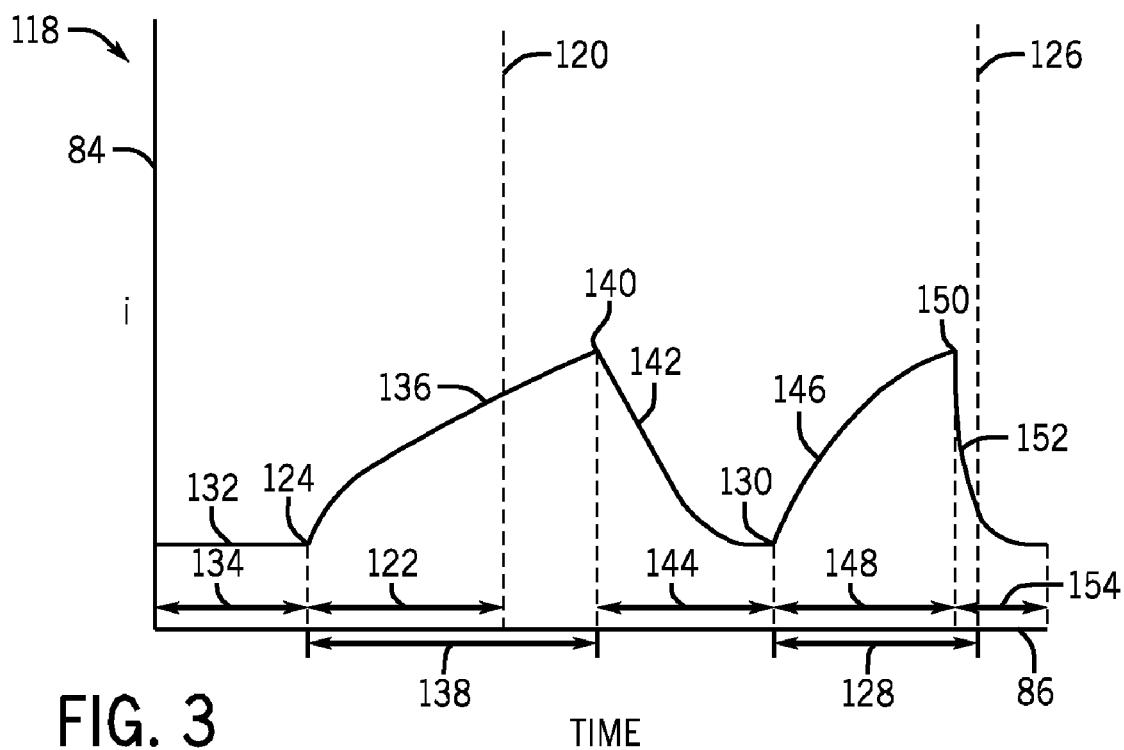
FIG. 3 is a graph illustrating an embodiment of a method for monitoring a spatter generating event using a threshold time period in accordance with aspects of the present disclosure.

FIG. 3 is a graph 118 illustrating an embodiment of a method for monitoring a spatter generating event based on a length of time of a short circuit (e.g., when the length of the short circuit is greater than three milliseconds). Specifically, the graph 118 illustrates the welding current 84 during time 86. A time 120 indicates the end of a threshold time period 122 that began at a start of a short circuit at point 124. As will be appreciated, in certain embodiments, the welding current 84 is increased as the duration of a short circuit increases. Therefore, if the short circuit that starts at point 124 last longer than the threshold time period 122, then it is likely that a significant spatter generating event occurred as a result of the short circuit that started at point 124. Further, a time 126 indicates the end of a threshold time period 128 that began at a start of a short circuit at point 130. If the short circuit that starts at point 130 last longer than the threshold time period 128, then it is likely that a significant spatter generating event occurred as a result of the short circuit that started at point 130. For short circuit durations that exceed the threshold time period 122, the following equation may be used: $I_{CLEAR}^2 * T_{SHORT}/(I_{AVG}^2)$. In this equation, $I_{CLEAR}^2$ represents the short circuit clearing current (e.g., current at point 140) squared, $I_{AVG}^2$ represents an average of the welding current 84 over a time period (e.g., such as 1 to 3 seconds) squared, and $T_{SHORT}$ (in milliseconds) represents the length of time of the short circuit (e.g., time 138 for the short represented by segment 136).

For example, at segment 132, the welding current 84 signifies a welding arc current during a time period 134. A short circuit starts at point 124 at the intersection of segments 132 and 136. The short circuit continues through segment 136 during a time period 138 until the short circuit clears at point 140. As discussed above, a significant spatter generating event is likely to occur when the time period 138 of the short circuit is greater than the threshold time period 122. Therefore, because the time period 138 is greater than the threshold time period 122, it is likely that a significant spatter generating event has occurred.

As another example, at segment 142, the welding current 84 signifies a welding arc current during a time period 144. A short circuit starts at point 130 at the intersection of segments 142 and 146. The short circuit continues through segment 146 during a time period 148 until the short circuit clears at point 150. Because the time period 148 is less than the threshold time period 128, it is likely that a spatter generating event has not occurred. As illustrated at segment 152, the welding current 84 returns to a welding arc current during time 154. Thus according to the method described using the graph 118, significant spatter generating events may be detected.

Figure 4:
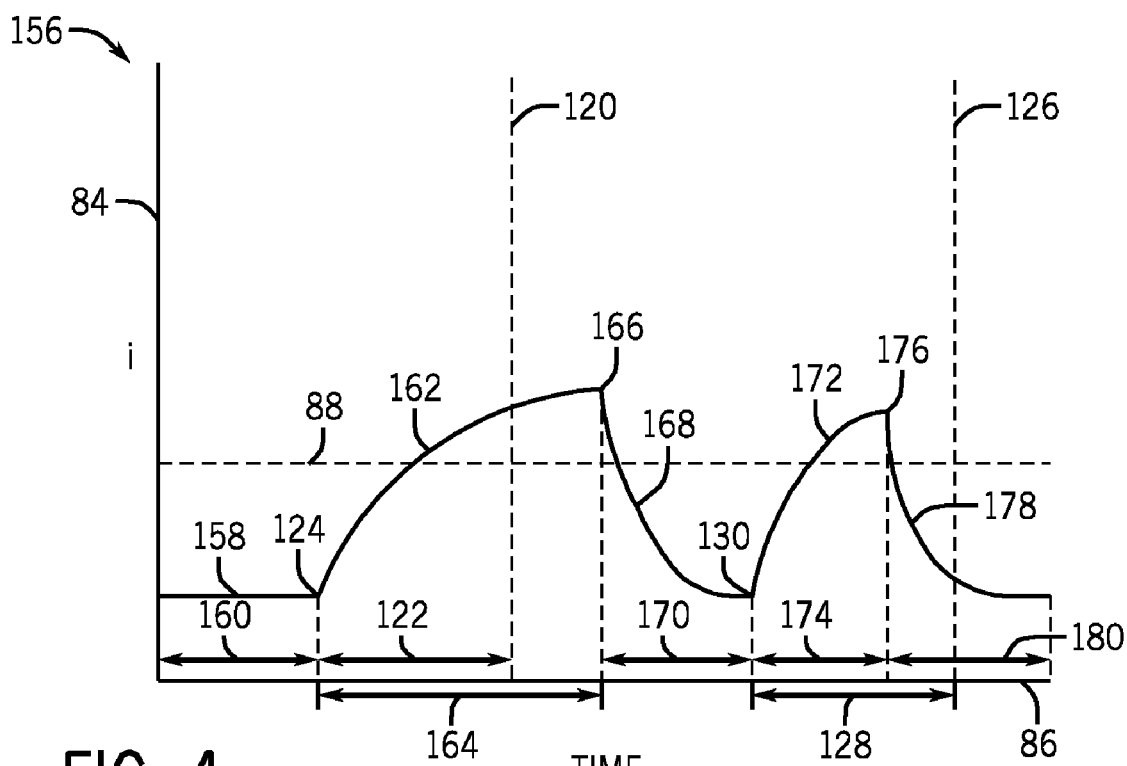
FIG. 4 is a graph illustrating an embodiment of a method for monitoring a spatter generating event using a combination of a threshold current and a threshold time period in accordance with aspects of the present disclosure.

FIG. 4 is a graph 156 illustrating an embodiment of a method for monitoring a spatter generating event using a combination of the threshold current 88 and a threshold time period. Specifically, the graph 156 illustrates the welding current 84 during time 86. In certain embodiments, if the short circuit that starts at point 124 has a peak current greater than the threshold current 88 and lasts longer than the threshold time period 122, then it is likely that a significant spatter generating event occurred as a result of the short circuit that started at point 124. Further, if the short circuit that starts at point 130 has a peak current greater than the threshold current 88 and lasts longer than the threshold time period 128, then it is likely that a significant spatter generating event occurred as a result of the short circuit that started at point 130. However, if the short circuit that starts at point 130 has a peak current greater than the threshold current 88 and a duration less than the threshold time period 128, then it is likely that a spatter generating event occurred as a result of the short circuit that started at point 130 (although the spatter generating event may not be as significant as a spatter event where both the threshold current 88 and threshold time period 128 are exceeded).

For example, at segment 158, the welding current 84 signifies a welding arc current during a time period 160. A short circuit starts at point 124 at the intersection of segments 158 and 162. The short circuit continues through segment 162 during a time period 164 until the short circuit clears at point 166. As discussed above, a significant spatter generating event is likely to occur when the short circuit clearing current at point 166 is greater than the threshold current 88 and the time period 164 of the short circuit is greater than the threshold time period 122. Therefore, because the short circuit clearing current at point 166 is greater than the threshold current 88 and the time period 164 is greater than the threshold time period 122, it is likely that a significant spatter generating event has occurred.

As another example, at segment 168, the welding current 84 signifies a welding arc current during a time period 170. A short circuit starts at point 130 at the intersection of segments 168 and 172. The short circuit continues through segment 172 during a time period 174 until the short circuit clears at point 176. Because the time period 174 is less than the threshold time period 128, it is likely that a significant spatter generating event has not occurred (although the short circuit clearing current at point 176 is greater than the threshold current 88). However, a small spatter generating event may have occurred. As illustrated at segment 178, the welding current 84 returns to a welding arc current during time 180. Thus according to the method described using the graph 156, significant spatter generating events may be detected.

Figure 5:
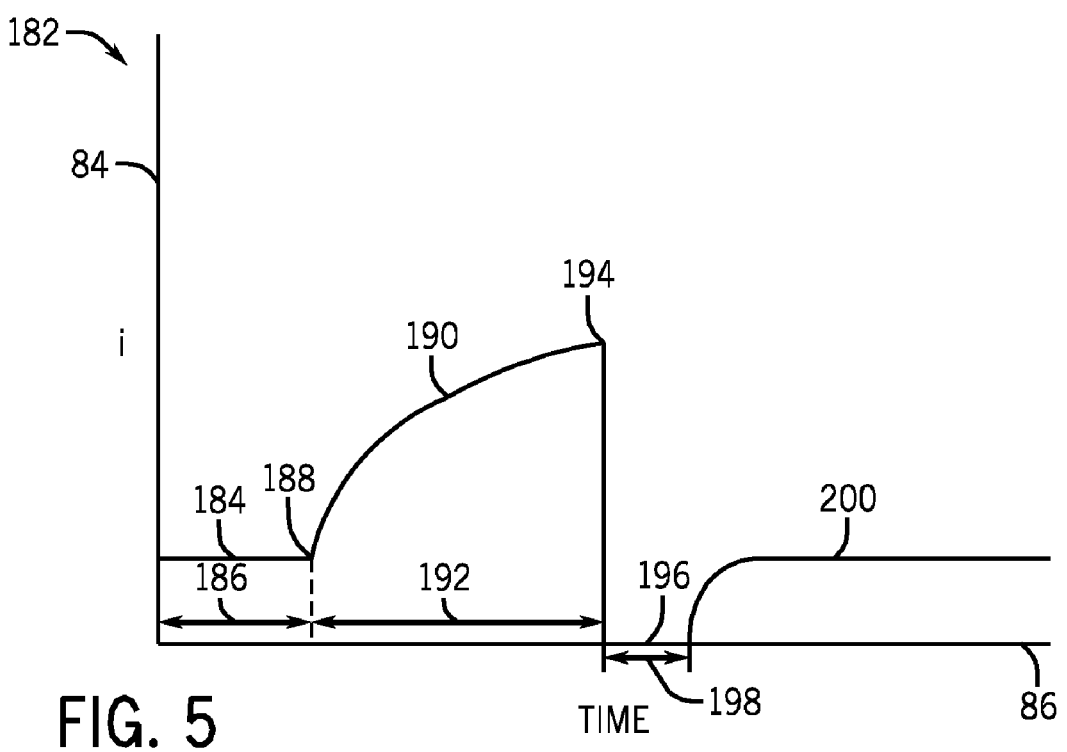
FIG. 5 is a graph illustrating an embodiment of a method for monitoring a spatter generating event using parameters detected after a short circuit occurs in accordance with aspects of the present disclosure.

FIG. 5 is a graph 182 illustrating an embodiment of a method for monitoring a spatter generating event using parameters detected after a short circuit occurs. Specifically, the graph 182 illustrates the welding current 84 during time 86. In certain embodiments, if the welding arc goes out after a short circuit occurs, it is likely that a significant spatter generating event has occurred.

For example, at segment 184, the welding current 84 signifies a welding arc current during a time period 186. A short circuit starts at point 188 at the intersection of segments 184 and 190. The short circuit continues through segment 190 during a time period 192 until the short circuit clears at point 194. After the short circuit clears at point 194, the welding arc goes out (signified by the loss of weld current 84) for segment 196 during a time period 198. The welding arc returns for segment 200. When the welding arc goes out during the segment 196 after the short circuit clears at point 194, it is likely that a significant spatter generating event has occurred.

Parameters associated with a short circuit followed by a welding arc going out can be used to determine a quantity of spatter generated. Specifically, a quantity of spatter may be calculated by the basic equation: D=R*T. The D in the equation represents the distance that welding wire travels to reestablish a welding arc after the welding arc has gone out. This distance provides a good approximation of the amount of welding wire that has been discharged in the corresponding spatter generating event. The R to determine the distance is the wire feed speed which is often controlled by the wire feeder 14. The T is the time between the end of the short (as detected by a loss of current, which signals an arc outage) and the reestablishment of the welding arc (as determined by detecting a welding current, which signals that the welding wire 52 has made contact with the weld pool or workpiece 60). For example, the time in relation to FIG. 5 would be time 198, the duration that the welding current is not present. Accordingly, the quantity of welding wire lost due to spatter may be determined.

Figure 6:
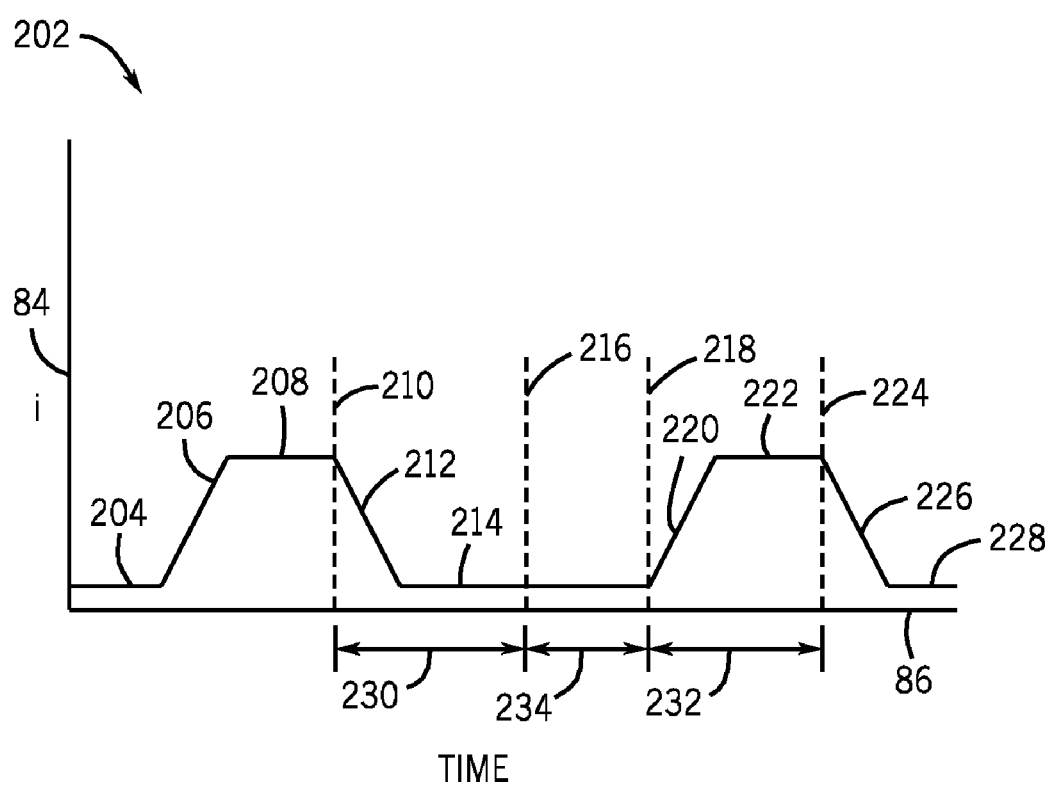
FIG. 6 is a graph illustrating an embodiment of a method for monitoring a spatter generating event during pulsed gas metal arc welding (GMAW-P) in accordance with aspects of the present disclosure.

FIG. 6 is a graph 202 illustrating an embodiment of a method for monitoring a spatter generating event during pulsed gas arc welding (GMAW-P). Specifically, the graph 202 provides a representation of a GMAW-P wave shape that is common in the industry (e.g., one version is described in U.S. Pat. No. 6,909,067, and a general description of welding waveshapes is described in U.S. Pat. No. 6,747,247) and illustrates the welding current 84 during time 86. During segment 204, the welding current 84 is low (e.g., commonly referred to as "Background current"). In certain embodiments, the Background current may be approximately 60 to 100 amps. A segment 206 represents a welding current 84 increase to reach a pulsed current which remains during segment 208 (e.g., commonly referred to as "Peak current"). In certain embodiments, the Peak current may be approximately 300 to 500 amps. At a time 210, the pulsed current ends and ramps down during segment 212 to a Background current level where the welding current 84 remains throughout segment 214. As illustrated, segment 214 is divided by a time 216, the purpose of which will be explained in detail below. At a time 218, the welding current 84 increases for a segment 220 to reach another pulsed current which remains during segment 222. At a time 224, the pulsed current ends and ramps down during segment 226 to a Background current level where the welding current 84 remains throughout segment 228.

During a pulse welding process the melting and transfer of material from the end of the torch 58 to the puddle may be partially driven by the wave shape (in contrast to short circuit transfer where the process is more reactionary to the interaction with the puddle). The direct control of welding current and knowledge of the status of the material transfer that occurs during the pulsed weld may enable more accurate spatter generation calculation. For example during a time period 230, the molten ball has just transferred or is in the final stages of transferring from the end of the welding wire 52 to the puddle. Short circuits may occur during time period 230, but they are typically brief and may not cause spatter. However, during a time period 232, a molten ball is at the end of the torch 58 and is not ready to be transferred. The molten ball may create significant spatter if a short circuit occurs. Furthermore, spatter generating events during a time period 234 may also produce spatter, but such spatter may be a smaller magnitude than spatter during period 232 (e.g., the molten ball is smaller and the current is lower).

A similar phenomenon may occur in other processes including short circuit processes, such as Short-by-Short as described in U.S. Pat. No. 6,326,591 (marketed as RMD by Miller Electric Mfg. Co.), where the transfer of welding wire 52 is controlled. Different phases of a controlled process may be included in a spatter generation calculation. That is, as described above, monitored signals may show signs that indicate a spatter generating event has occurred. For example, during one period of a controlled wave shape spatter is generated and during a different period no spatter is generated, even though very similar signals are produced. Thus, the association of possible spatter generating events to the actual state of the material transfer may be included in the determination of the amount of spatter generated.

Likewise, starting and/or stopping welding processes may have unique characteristics. For example, when starting a welding process the base material may be cold, the welding wire 52 may be cold, the welding wire 52 may touch a solid plate instead of a molten puddle, and so forth. Therefore, different analysis of monitored signals may be used to more accurately report spatter generation.

As will be appreciated, an arc flare event is a condition that may be described as a sudden increase in arc length which may result in a significant spatter generator. An arc flare may occur immediately following a short circuit or anytime during a welding process. An arc flare is similar to an arc outage, accordingly, a section of welding wire 52 may be expelled from a torch 58 and be considered spatter. However, unlike an arc outage an arc flare event does not extinguish the arc. In contrast, during an arc flare, the arc remains lit with current still flowing. In the present embodiment, a voltage flare detection threshold ($V_{FLARE\_THRESHOLD}$) may be set to a level equal to the following formula: $V_{FLARE\_THRESHOLD}$=Voltage Command+(Sampled Current*K), where K is a constant. The constant K may be different for various wire types and/or sizes. Once the arc voltage exceeds the $V_{FLARE\_THRESHOLD}$, the average spatter severity level may be increased at a predetermined rate until either a short circuit is detected or the sampled voltage falls below a predetermined level. Using such a method allows a spatter generating event not associated with the clearing of a short circuit to be detected.

Figure 7:
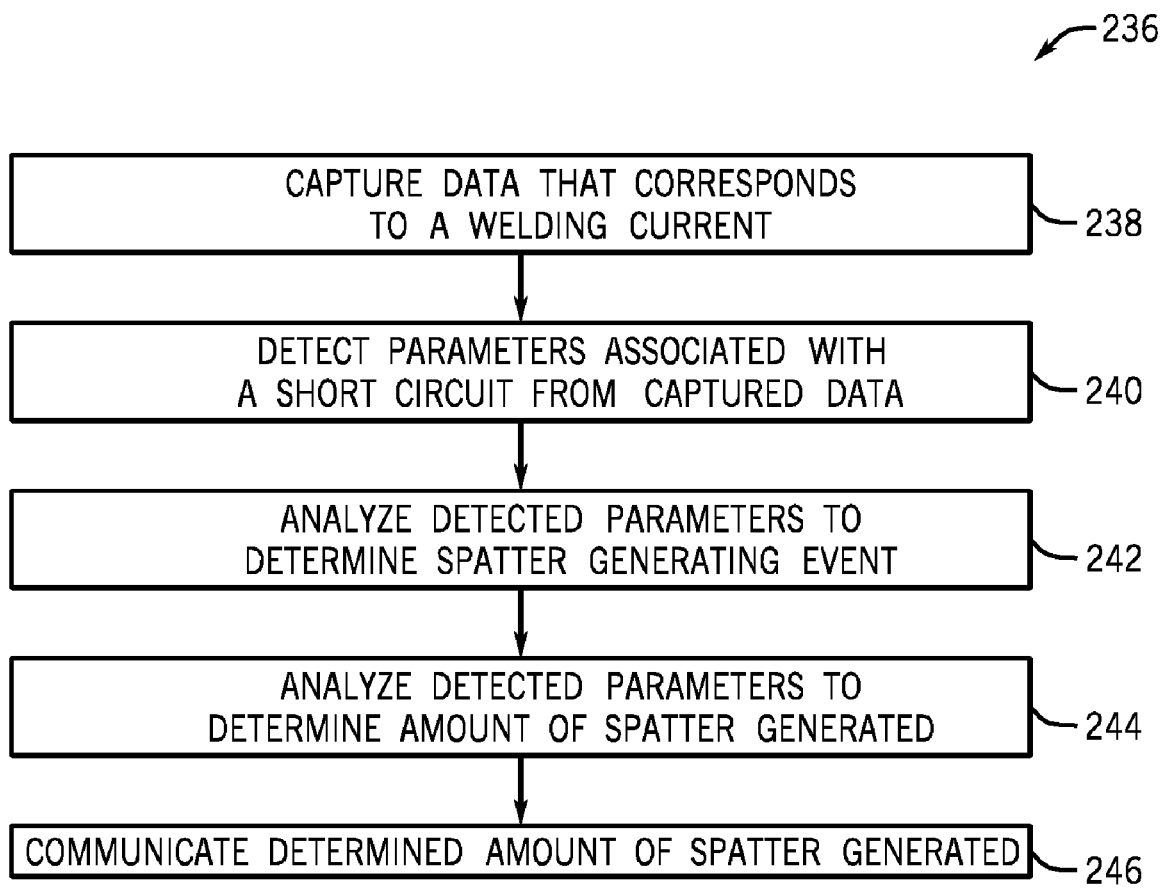
FIG. 7 is a flow chart of an embodiment of a method for monitoring an amount of spatter generated during a welding application in accordance with aspects of the present disclosure.

FIG. 7 is a flow chart 236 of an embodiment of a method for monitoring an amount of spatter generated during a welding application. At block 238, data that corresponds to welding feedback signals (e.g., welding current) of the welding application is captured. The data may be logged in the welding power supply 12, the wire feeder 14, or some other device. Such data may include the welding current, a welding voltage, a welding power, a welding circuit resistance, a wire feed speed (or other mathematical derivation from the system feedback signals), a time stamp that relates to the welding current, identification data of the welding operator performing the welding, the welding power supply 12 configuration, the wire feeder 14 configuration, a work order number, a welding wire lot number, a consumable lot number, a consumable part number, a type of part being welded, a serial number of the part being welded, a type of weld in a series of welds, a shift, a date, and so forth. In certain embodiments, the data may be transferred to a processing device, such as the welding monitoring system 72, the welding helmet 70, and so forth. As will be appreciated, the term "capture" or "capturing" is not restricted to the device that originally logs and/or monitors the welding feedback signals (e.g., welding current). For example, data may be considered "captured" by the welding monitoring system 72 after it is transferred to, stored on, or accessed by the welding monitoring system 72.

At block 240, parameters associated with a short circuit are detected from the captured data. For example, the parameters associated with a short circuit may include a duration of the short circuit, a short circuit current, a short circuit voltage, a short circuit clearing current, a welding current immediately after a short circuit clears, a time period where a welding arc is not established, a wire feed speed, an average weld current, and so forth. The parameters associated with the short circuit may be detected using hardware, software, or some combination thereof. For example, data processing software may be used to detect parameters associated with the short circuit.

Next, at block 242, the detected parameters are analyzed to determine when spatter generating events have occurred during the welding application. For example, the analysis may use one of the following logical tests to determine whether it is likely that a substantial spatter generating event has occurred: whether the duration of the short circuit is greater than a threshold time period, whether the short circuit current is greater than a threshold current, whether the duration of the short circuit is greater than a threshold time period and the short circuit current is greater than a threshold current, whether an arc flare event occurred, whether the welding current that occurs immediately after the short circuit signifies that a welding arc is not established (e.g., the welding current is approximately 0 amps), whether welding power is greater than a threshold power, whether a resistance of the welding circuit crosses a threshold resistance, whether a rate of change of any parameter exceeds a threshold, whether a result of a mathematical formula applied to any combination of parameters exceeds a threshold, whether a data trend is detected, and so forth.

At block 244, the detected parameters are analyzed to determine an amount and/or severity of spatter generated by the spatter generating events. In certain embodiments, the amount and/or severity of the spatter generated by the spatter generating events may be determined by using one of the following formulas: multiplying a time period after the short circuit where a welding arc is not established by the wire feed speed, dividing a square of the short circuit clearing current by the product of the duration of the short circuit and a square of the average weld current, dividing a square of the short circuit clearing current by the square of the average weld current, and so forth.

Then, at block 246, the occurrence of a spatter generating event and/or the determined amount of spatter (absolute or relative) generated by the spatter generating event is communicated to a device such as a display or speaker. In certain embodiments, an average count of spatter events per unit of time may be communicated to the device. As discussed previously, the occurrence of a spatter generating event and/or the determined amount of spatter generated by the spatter generating event may be displayed on the welding power supply 12, the wire feeder 14, the welding helmet 70, the welding monitoring system 72, or another device. In certain embodiments, displaying the determined amount of spatter may include displaying an aggregate of the determined amount of spatter during the welding application. The aggregate of the determined amount of spatter may be configured to increase as spatter generating events occur during the welding application. As will be appreciated, the determined amount of spatter (absolute or relative) and/or the occurrence of a spatter generating event may be displayed (or communicated to the operator, a supervisor, or a team member via another means such as vibration, audio, email, text message, and so forth) in real time (e.g., very shortly after an occurrence of a spatter generating event), near real time, or at a later time. When provided in real time, the spatter data may provide feedback quickly to a welding operator that allows the welding operator to learn how to limit the amount of spatter during the welding application (e.g., by changing the conditions or variables associated with the welding application). Such data may be useful for training welding operators or alerting management to focus areas for improvement via training, work fixture changes, design changes, and so forth.

In certain embodiments, data relating to the occurrence of a spatter generating event and/or the determined amount of spatter generated by the spatter generating event may be logged for future analysis. Such analysis may further divide the data to analyze the spatter for a particular weld, for a last weld performed, for a part that has been welded, and so forth. In addition, the data from multiple welding devices may be combined into a database for analysis of spatter data relating to a particular welding operator, a shift of welding operators, an experience level of welding operators, and so forth. As will be appreciated, the data in the database may be used for providing welding operators and/or managing personnel with spatter reports, such reports may include data related to a week, a day, a shift, a welding operator, a fixture, or a part being welded, for example. Spatter reports may be used to help welding operators and managers improve welding quality, identify operating conditions that are affecting the amount of spatter generated, identify poor quality consumables, identify poor quality materials, identify tools and/or fixtures that may reduce spatter, and so forth. In certain embodiments, the database data may be used to provide the welding operator with a score or ranking to allow the welding operator and/or managing personnel to analyze how welding operators perform relative to each other.

It should be noted that the tolerance level for the amount of spatter generated during a welding application may vary based on the industry or particular application, for example. Accordingly, the criteria for what constitutes a substantial spatter generating event may vary between welding applications. As such, the thresholds (e.g., short circuit current, short circuit duration) may be modified based on the welding application. For example, certain parts may be rated as "class A" parts (e.g., for parts with a minimal amount of allowed spatter), "class B" parts (e.g., for parts with a moderate amount of allowed spatter), and "class C" parts (e.g., for parts with a high amount of allowed spatter). As will be appreciated, the amount of spatter generating events associated with a part may be used to determine whether grinding is needed on the parts to remove excess spatter. Using the embodiments discussed above, spatter generating events may be tracked, monitored, quantified, and/or analyzed. Accordingly, data relating to the spatter generating events may be used to limit the amount of spatter that occurs during welding applications and thereby improve the quality of welds.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A weld monitoring system comprising:
    a sensor configured to capture data representative of a welding current of a welding application; and
    control circuitry configured to:
        detect a parameter relating to a short circuit from the captured welding current data;
        analyze the parameter relating to the short circuit to monitor a spatter generating event during the welding application; and
        determine an amount of spatter generated by the spatter generating event.

2. The weld monitoring system of claim 1, wherein the parameter relating to the short circuit comprises timing of the short circuit.

3. The weld monitoring system of claim 1, wherein the parameter relating to the short circuit comprises a duration of the short circuit.

4. The weld monitoring system of claim 1, wherein the parameter relating to the short circuit comprises an arc voltage.

5. The weld monitoring system of claim 1, wherein the parameter relating to the short circuit comprises a short circuit current.

6. The weld monitoring system of claim 1, wherein the weld monitoring system is configured to determine an occurrence of the spatter generating event by determining whether the parameter relating to the short circuit is greater than a threshold.

7. The weld monitoring system of claim 6, wherein the threshold is a function of voltage.

8. The weld monitoring system of claim 6, wherein the threshold is a function of current.

9. The weld monitoring system of claim 1, wherein the weld monitoring system is configured to communicate an occurrence of the spatter generating event.

10. The weld monitoring system of claim 9, wherein the weld monitoring system is configured to communicate the occurrence of the spatter generating event in substantially real time.

11. The weld monitoring system of claim 9, wherein the weld monitoring system is configured to communicate the occurrence of the spatter generating event to a welding helmet.

12. The weld monitoring system of claim 9, wherein the weld monitoring system comprises a display on which the weld monitoring system displays information relating to the spatter generating event.

13. The weld monitoring system of claim 1, wherein the weld monitoring system is configured to analyze a wave shape to monitor the spatter generating event.

14. The weld monitoring system of claim 1, wherein the weld monitoring system is configured to count the spatter generating event.

15. The weld monitoring system of claim 1, wherein the weld monitoring system is configured to determine the amount of spatter based at least in part on a time between an end of the short circuit and reestablishment of a welding arc.

16. The weld monitoring system of claim 1, wherein the weld monitoring system is configured to determine an aggregate of the determined amount of spatter during the welding application, wherein the aggregate of the determined amount of spatter increases as spatter generating events occur.

17. The weld monitoring system of claim 16, wherein the weld monitoring system is configured to determine the aggregate of the amount of spatter for a particular weld.

18. The weld monitoring system of claim 16, wherein the weld monitoring system is configured to determine the aggregate of the amount of spatter for a particular part being welded upon.

19. A weld monitoring system comprising:
   a sensor configured to capture data representative of a welding current of a welding application; and
   control circuitry configured to:
      detect a plurality of parameters relating to a short circuit from the welding current, the plurality of parameters comprising a short circuit clearing current, a duration of the short circuit, and an average weld current;
      analyze the plurality of parameters relating to the short circuit to monitor a spatter generating event during the welding application;
      determine an amount of spatter generated by the spatter generating event by dividing a square of the short circuit clearing current by a product of the duration of the short circuit and a square of the average weld current; and
      communicate an occurrence of the spatter generating event, or the amount of spatter generated by the spatter generating event, to a user.

20. A welding device comprising:
communications circuitry configured to receive data representative of a welding current of a welding application; and
control circuitry configured to:
   detect a parameter relating to a short circuit from the captured welding current data;
   analyze the parameter relating to the short circuit to monitor a spatter generating event during the welding application;
   determine an amount of spatter generated by the spatter generating event; and
   communicate an occurrence of the spatter generating event, or the amount of spatter generated by the spatter generating event, to a user.

* * * * *